United States Patent
Moon et al.

(10) Patent No.: US 11,789,361 B2
(45) Date of Patent: Oct. 17, 2023

(54) SEMICONDUCTOR RESIST COMPOSITION, AND METHOD OF FORMING PATTERNS USING THE COMPOSITION

(71) Applicant: SAMSUNG SDI CO., LTD., Yongin-si (KR)

(72) Inventors: Kyung Soo Moon, Suwon-si (KR); Jaehyun Kim, Suwon-si (KR); Yoong Hee Na, Suwon-si (KR); Ran Namgung, Suwon-si (KR); Hwansung Cheon, Suwon-si (KR); Seungyong Chae, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 17/361,235

(22) Filed: Jun. 28, 2021

(65) Prior Publication Data

US 2021/0325781 A1    Oct. 21, 2021

Related U.S. Application Data

(60) Division of application No. 16/712,701, filed on Dec. 12, 2019, now Pat. No. 11,092,890, which is a
(Continued)

(30) Foreign Application Priority Data

Jul. 31, 2018    (KR) .................. 10-2018-0089414
Jul. 25, 2019    (KR) .................. 10-2019-0090516

(51) Int. Cl.
*G03F 7/004*    (2006.01)
*H01L 21/02*    (2006.01)
(Continued)

(52) U.S. Cl.
CPC .......... *G03F 7/0042* (2013.01); *C07F 7/2224* (2013.01); *G03F 1/22* (2013.01);
(Continued)

(58) Field of Classification Search
CPC ........................................................ G03F 1/22
See application file for complete search history.

(56) References Cited

U.S. PATENT DOCUMENTS 5,061,599 A    10/1991    Kudo et al.
6,495,298 B1 *  12/2002    Fujishiro .............. G03F 7/0007
                                                    522/18

(Continued)

FOREIGN PATENT DOCUMENTS

CN    101536151 A    9/2009
CN    108351594 A    7/2018
(Continued)

OTHER PUBLICATIONS

Anderson, Christopher N. et al., "The SEMATECH Berkeley MET: extending EUV learning down to 16nm half pitch", Proc. of SPIE, vol. 7969, 2011, 7pp.

(Continued)

*Primary Examiner* — Chanceity N Robinson
(74) *Attorney, Agent, or Firm* — Lewis Roca Rothgerber Christie LLP

(57) ABSTRACT

A semiconductor resist composition includes an organometallic compound represented by Chemical Formula 1 and a solvent:

(Continued)

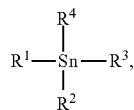

Chemical Formula 1 wherein, in Chemical Formula 1, $R^1$ is an aliphatic hydrocarbon group, an aromatic hydrocarbon group, or an -alkyl-O-alkyl group, and $R^2$ to $R^4$ are each independently selected from —$OR^a$ and —$OC(=O)R^b$. The semiconductor resist composition may have excellent solubility and storage stability.

10 Claims, 6 Drawing Sheets

Related U.S. Application Data continuation-in-part of application No. 16/211,145, filed on Dec. 5, 2018, now Pat. No. 11,092,889.

(51) Int. Cl.
| | |
|---|---|
| G03F 7/09 | (2006.01) |
| C07F 7/22 | (2006.01) |
| G03F 7/075 | (2006.01) |
| H01L 21/467 | (2006.01) |
| H01L 21/475 | (2006.01) |
| H01L 21/47 | (2006.01) |
| G03F 1/22 | (2012.01) |

(52) U.S. Cl.
CPC ............ G03F 7/0751 (2013.01); G03F 7/094 (2013.01); H01L 21/02118 (2013.01); H01L 21/467 (2013.01); H01L 21/47 (2013.01); H01L 21/475 (2013.01)

(56) References Cited

U.S. PATENT DOCUMENTS

| | | | |
|---|---|---|---|
| 6,689,540 B2 | 2/2004 | Aviram et al. | |
| 7,294,449 B1 | 11/2007 | Gudeman et al. | |
| 9,164,383 B2 | 10/2015 | Hatakeyama | |
| 9,261,784 B2 | 2/2016 | Wuister et al. | |
| 9,372,402 B2 | 6/2016 | Freedman et al. | |
| 2003/0088959 A1 | 5/2003 | Tsujimoto | |
| 2004/0248032 A1 | 12/2004 | Zampini et al. | |
| 2010/0009274 A1 | 1/2010 | Yamamoto | |
| 2011/0045406 A1 | 2/2011 | Keszler et al. | |
| 2016/0116839 A1 | 4/2016 | Meyers et al. | |
| 2016/0230019 A1 | 8/2016 | Yao et al. | |
| 2016/0240816 A1* | 8/2016 | Mizutani | G03F 7/0397 |
| 2017/0102612 A1 | 4/2017 | Meyers et al. | |
| 2017/0269476 A1 | 9/2017 | Nakagawa et al. | |
| 2018/0362551 A1 | 12/2018 | Dilocker et al. | |
| 2019/0310551 A1 | 10/2019 | Minegishi et al. | |
| 2019/0310552 A1 | 10/2019 | Asano et al. | |
| 2019/0315781 A1 | 10/2019 | Edson et al. | |
| 2019/0315782 A1 | 10/2019 | Edson et al. | |
| 2019/0384171 A1 | 12/2019 | Zi et al. | |
| 2020/0041897 A1 | 2/2020 | Moon et al. | |
| 2020/0117085 A1 | 4/2020 | Moon et al. | |

FOREIGN PATENT DOCUMENTS

| | | |
|---|---|---|
| JP | 7-134418 A | 5/1995 |
| JP | 2683536 B2 | 8/1997 |
| JP | 10-36826 A | 2/1998 |
| JP | 2002-72401 A | 3/2002 |
| JP | 2003-506532 A | 2/2003 |
| JP | 2003-152058 A | 5/2003 |
| JP | 2004-295104 A | 10/2004 |
| JP | 3990146 B2 | 7/2007 |
| JP | 2009-134088 A | 6/2009 |
| JP | 2011111550 A | 6/2011 |
| JP | 5178858 B2 | 1/2013 |
| JP | 5650086 B2 | 11/2014 |
| JP | 5708521 B2 | 3/2015 |
| JP | 6004649 B2 | 9/2016 |
| JP | 2017-207532 A | 11/2017 |
| JP | 2018-502173 A | 1/2018 |
| JP | 2018-507933 A | 3/2018 |
| KR | 10-0269513 B1 | 10/2000 |
| KR | 10-0398312 B1 | 9/2003 |
| KR | 10-2004-0078584 A | 9/2004 |
| KR | 10-2009-0039930 A | 4/2009 |
| KR | 10-2014-0121826 A | 10/2014 |
| KR | 10-2017-0022945 A | 3/2017 |
| KR | 10-2017-0066225 A | 6/2017 |
| KR | 10-2017-0116134 A | 10/2017 |
| KR | 10-2018-0054917 A | 5/2018 |
| TW | 201943725 A | 11/2019 |
| WO | WO 2016/140057 A1 | 9/2016 |
| WO | WO-2016140057 A1 * | 9/2016 | ............ C08F 212/08 |
| WO | WO 2017/066319 A2 | 4/2017 |
| WO | WO-2017066319 A2 * | 4/2017 | ............ C23C 14/086 |
| WO | WO-2017066319 A3 * | 8/2017 | ............ C23C 14/086 |
| WO | 2018/123537 A1 | 7/2018 |
| WO | WO 2018/123388 A1 | 7/2018 |

OTHER PUBLICATIONS

Okamoto, Hiroshi et al., "Peroxopolytungstic acids: A new inorganic resist material", Applied Physics Letters, 49(5), Aug. 4, 1986, pp. 298-300.

Stowers, Jason K. et al., "Directly patterned inorganic hardmask for EUV lithography", Proc. of SPIE, vol. 7969, 2011, 12pp.

Taiwanese Patent Office Action dated Apr. 7, 2020 with accompanying Taiwanese Search Report dated Apr. 6, 2020 (Chinese only) for corresponding Taiwanese Patent Application No. 108126970, 5 pages.

U.S. Restriction Requirement dated Jun. 10, 2020, issued in U.S. Appl. No. 16/211,145 (6 pages).

Japanese Office Action dated Jul. 14, 2020, for corresponding Japanese Patent Application No. 2019-140074 (3 pages).

U.S. Office Action dated Aug. 17, 2020, issued in U.S. Appl. No. 16/211,145 (12 pages).

U.S. Restriction Requirement dated Aug. 17, 2020, issued in U.S. Appl. No. 16/712,701 (6 pages).

U.S. Office Action dated Oct. 20, 2020, issued in U.S. Appl. No. 16/712,701 (12 pages).

U.S. Office Action for U.S. Appl. No. 16/211,068 dated Nov. 10, 2020, 17 pages.

Korean Office Action dated Dec. 17, 2020, for corresponding Korean Patent Application No. 10-2019-0090516 (6 pages).

U.S. Final Office action dated Jan. 14, 2021, issued in U.S. Appl. No. 16/211,145 (8 pages).

U.S. Final Office action dated Jan. 26, 2021, issued in U.S. Appl. No. 16/712,701 (11 pages).

U.S. Notice of Allowance dated Apr. 9, 2021, issued in U.S. Appl. No. 16/211,145 (8 pages).

U.S. Notice of Allowance dated Apr. 12, 2021, issued in U.S. Appl. No. 16/712,701 (8 pages.

U.S. Final Office Action dated Apr. 20, 2021, issued in U.S. Appl. No. 16/211,068 (14 pages).

Korean Notice of Allowance dated Jun. 21, 2021, issued in corresponding Korean Patent Application No. 10-2019-0090516 (6 pages).

U.S. Office Action dated Apr. 8, 2022, issued in U.S. Appl. No. 17/365,926 (10 pages).

Chinese Office Action, with English translation, dated Sep. 20, 2022, issued in corresponding Chinese Patent Application No. 201910694739.X (12 pages).

U.S. Office Action dated Sep. 9, 2022, issued in U.S. Appl. No. 17/365,926 (8 pages).

(56) References Cited

OTHER PUBLICATIONS

U.S. Final Office Action dated Dec. 23, 2022, issued in U.S. Appl. No. 17/365,926 (12 pages).

\* cited by examiner

SEMICONDUCTOR RESIST COMPOSITION, AND METHOD OF FORMING PATTERNS USING THE COMPOSITION

CROSS-REFERENCE TO RELATED APPLICATION

This application is a divisional application of U.S. patent application Ser. No. 16/712,701, filed Dec. 12, 2019, which is a continuation-in-part of U.S. patent application Ser. No. 16/211,145, filed on Dec. 5, 2018, and which claims priority to and the benefit of Korean Patent Application Nos. 10-2018-0089414 filed in the Korean Intellectual Property Office on Jul. 31, 2018, and 10-2019-0090516 filed in the Korean Intellectual Property Office on Jul. 25, 2019, the entire contents of all of which are incorporated herein by reference.

BACKGROUND

1. Field

One or more aspects of embodiments of this disclosure are directed toward a semiconductor resist composition and a method of forming patterns using the composition.

2. Description of the Related Art

EUV (extreme ultraviolet) lithography is recently being looked at as one essential technology for manufacturing next generation semiconductor devices. The EUV lithography is a pattern-forming technology using an EUV ray having a wavelength of about 13.5 nm as an exposure light source. By utilizing the EUV lithography, an extremely fine pattern (e.g., a pattern having a width of less than or equal to about 20 nm) may be formed in an exposure process during a manufacture of a semiconductor device.

The extreme ultraviolet (EUV) lithography is realized through development of compatible photoresists which can be performed at a spatial resolution (of the photoresist) of less than or equal to about 16 nm. Currently, efforts are being made to satisfy insufficient specifications of related chemically amplified (CA) photoresists such as resolution, photospeed, and feature roughness (e.g., line edge roughness (LER)) for the next generation devices.

An intrinsic image blur due to an acid catalyzed reaction in these polymer-type photoresists (e.g., polymer photoresists) limits a resolution in small feature sizes, which is a known phenomenon in electron beam (e-beam) lithography. The chemically amplified (CA) photoresists are designed for high sensitivity. However, in related CA photoresists, their elemental makeups may reduce light absorbance of the photoresists at a wavelength of about 13.5 nm and thus may decrease their sensitivity. Thus, the chemically amplified (CA) photoresists may partially have more difficulties under an EUV exposure.

For example, the CA photoresists may have difficulties in the small feature sizes due to roughness issues, for example, line edge roughness (LER) of the CA photoresists experimentally turns out to be increased, as a photospeed is decreased partially due to an essence of acid catalyst processes. Accordingly, a novel high performance photoresist is required in a semiconductor industry because of these defects and problems of the CA photoresists.

SUMMARY

One or more aspects of embodiments of the present disclosure are directed toward a semiconductor resist composition having improved etch resistance, sensitivity and ease of handling.

One or more aspects of embodiments of the present disclosure are directed toward a method of forming patterns using the semiconductor resist composition.

A semiconductor resist composition according to an embodiment includes an organometallic compound represented by Chemical Formula 1 and a solvent.

Chemical Formula 1

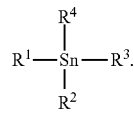

In Chemical Formula 1, $R^1$ may be selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 to C30 benzyl group, and —$R^c$—O—$R^d$ (wherein $R^c$ is a substituted or unsubstituted C1 to C20 alkylene group and $R^d$ is a substituted or unsubstituted C1 to C20 alkyl group), $R^2$ to $R^4$ may each independently be selected from —O$R^a$ and —OC(=O)$R^b$, $R^a$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and combinations thereof, and $R^b$ is selected from hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and combinations thereof.

A method of forming patterns according to another embodiment includes forming an etching subject layer on a substrate, coating the semiconductor resist composition on the etching subject layer to form a photoresist layer, patterning the photoresist layer to form a photoresist pattern, and etching the etching subject layer using the photoresist pattern as an etching mask.

The semiconductor resist composition according to an embodiment has relatively excellent (e.g., suitable) etch resistance and sensitivity and may be easily handled, and thus may provide a photoresist pattern having improved sensitivity and limit resolution, and a high aspect ratio without a pattern collapse.

DETAILED DESCRIPTION

Figure 1:
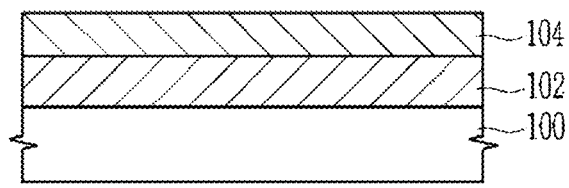
FIGS. 1-5 are cross-sectional views of acts of a method of forming patterns using a semiconductor resist composition according to an embodiment.

Hereinafter, the example embodiments of the present invention will be described in more detail, referring to the accompanying drawings. However, in the description of the present disclosure, descriptions of functions or components that are well known in the art will not be provided.

In the present disclosure and drawings, the same reference numerals refer to the same or like components throughout. In addition, since the size and the thickness of each component shown in the drawings are optionally represented for convenience of the description, the present disclosure is not limited to the provided illustrations. For example, in the drawings, the thickness of layers, films, panels, regions, etc., may be exaggerated for clarity, and the thickness of a part of layers or regions, etc., may be exaggerated for clarity.

It will be understood that when an element such as a layer, film, region, or substrate is referred to as being "on" another element, it can be directly on the other element or intervening elements may also be present.

In this disclosure, "substituted" may refer to replacement of a hydrogen atom of any given compound or functional group by at least one selected from deuterium, a halogen, a hydroxy group, an amino group, a substituted or unsubstituted C1 to C30 amine group, a nitro group, a substituted or unsubstituted C1 to C40 silyl group, a C1 to C30 alkyl group, a C1 to C10 haloalkyl group, a C1 to C10 alkylsilyl group, a C3 to C30 cycloalkyl group, a C6 to C30 aryl group, a C1 to C20 alkoxy group, and a cyano group. "Unsubstituted" may refer to any given compound or functional group in which the hydrogen atoms are not replaced by another substituent.

As used herein, when a definition is not otherwise provided, "alkyl group" may refer to a linear or branched aliphatic hydrocarbon group. The alkyl group may be "a saturated alkyl group" without any double bond or triple bond.

The alkyl group may be, for example, a C1 to C20 alkyl group. More specifically, the alkyl group may be a C1 to C10 alkyl group or a C1 to C6 alkyl group. For example, a C1 to C4 alkyl group may have one to four carbon atoms in the alkyl chain, and may be selected from methyl, ethyl, propyl, iso-propyl, n-butyl, isobutyl, sec-butyl, and t-butyl.

Non-limiting examples of the alkyl group may include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, when a definition is not otherwise provided, "a cycloalkyl group" may refer to a monovalent cyclic aliphatic hydrocarbon group.

As used herein, "an aryl group" may refer to a cyclic aromatic group in which all ring-forming atoms have a p-orbital and these p-orbitals are conjugated. The aryl group may be a monocyclic or fused ring polycyclic functional group (i.e., a group having rings sharing adjacent pairs of carbon atoms).

A semiconductor resist composition according to an embodiment of the present invention may include an organometallic compound and a solvent.

The organometallic compound includes various organic groups bound to a central metal atom and is represented by Chemical Formula 1:

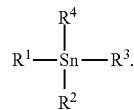

Chemical Formula 1

In Chemical Formula 1, $R^1$ may be selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 to C30 benzyl group, and —$R^c$—O—$R^d$ ($R^c$ is a substituted or unsubstituted C1 to C20 alkylene group and $R^d$ is a substituted or unsubstituted C1 to C20 alkyl group), $R^2$ to $R^4$ may each independently be selected from —$OR^a$ and —$OC(=O)R^b$, $R^a$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and combinations thereof, and $R^b$ is selected from hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and combinations thereof.

In an embodiment, $R^1$ is bonded with Sn (tin) and thus may improve the solubility of the organometallic compound in an organic solvent. In an embodiment, the Sn—$R^1$ bond may be dissociated by an extreme ultraviolet (UV) exposure to generate radicals. For example, $R^1$ may be selected from a substituted or unsubstituted C1 to C10 alkyl group, a substituted or unsubstituted C3 to C20 cycloalkyl group, a substituted or unsubstituted C3 to C20 alkenyl group, a substituted or unsubstituted C3 to C20 alkynyl group, and —$R^c$—O—$R^d$ ($R^c$ is a substituted or unsubstituted C1 to C20 alkylene group and $R^d$ is a substituted or unsubstituted C1 to C20 alkyl group).

In an embodiment, unlike a $R^1$—Sn bond, a bond between any of $R^2$ to $R^4$ and Sn may be a metal-oxygen bond. In an embodiment, at least one of $R^2$ to $R^4$ may be —$OC(=O)R^b$. For example, at least two of $R^2$ to $R^4$ may be —$OC(=O)R^b$. In some embodiments, $R^2$ to $R^4$ may be all —$OC(=O)R^b$. When at least one of $R^2$ to $R^4$ includes —$OC(=O)R^b$, a pattern formed by using the semiconductor resist composition including the same may exhibit excellent sensitivity and limit resolution.

However, embodiments of the present disclosure are not limited thereto and at least one of $R^2$ to $R^4$ may be —$OR^a$ or all of $R^2$ to $R^4$ may be —$OR^a$.

In an embodiment, $R^a$ is selected from a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group, and $R^b$ is selected from hydrogen, a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group.

The organometallic compound represented by Chemical Formula 1 is an organic tin (Sn)-containing compound, and may have excellent (e.g., suitable) sensitivity to light having high energy because the tin strongly absorbs extreme ultraviolet (UV) ray at about 13.5 nm. Accordingly, the organic tin-containing compound according to an embodiment may show improved stability and sensitivity compared with related organic and/or inorganic resists.

In an embodiment, the organometallic compound may be represented by at least one of Chemical Formula 2 to Chemical Formula 4:

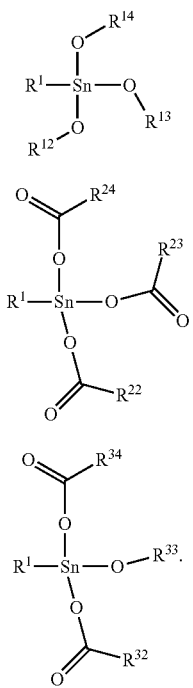

Chemical Formula 2

Chemical Formula 3

Chemical Formula 4

In Chemical Formula 2 to Chemical Formula 4, $R^1$ may be selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 to C30 benzyl group, and —$R^c$—O—$R^d$ ($R^c$ is a substituted or unsubstituted C1 to C20 alkylene group and $R^d$ is a substituted or unsubstituted C1 to C20 alkyl group), $R^{12}$, $R^{13}$, $R^{14}$, and $R^{33}$ are each independently selected from a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group, and $R^{22}$, $R^{23}$, $R^{24}$, $R^{32}$, and $R^{34}$ are each independently selected from hydrogen, a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group.

For example, $R^1$ may be selected from a substituted or unsubstituted C1 to C10 alkyl group, a substituted or unsubstituted C3 to C20 cycloalkyl group, a substituted or unsubstituted C3 to C20 alkenyl group, a substituted or unsubstituted C3 to C20 alkynyl group, and —$R^c$—O—$R^d$ (wherein $R^c$ is a substituted or unsubstituted C1 to C20 alkylene group and $R^d$ is a substituted or unsubstituted C1 to C20 alkyl group).

In an embodiment, the organometallic compound according to embodiments of the present disclosure may be represented by at least one of Chemical Formula 5 to Chemical Formula 13:

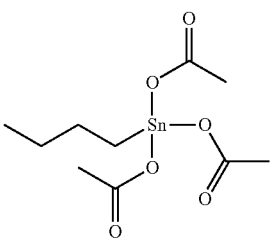

Chemical Formula 5

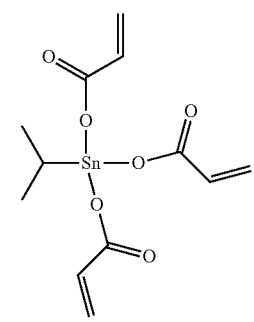

Chemical Formula 6

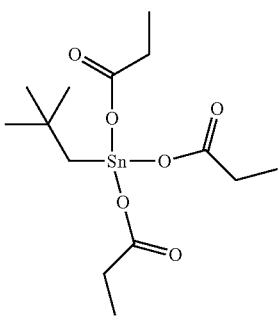

Chemical Formula 7

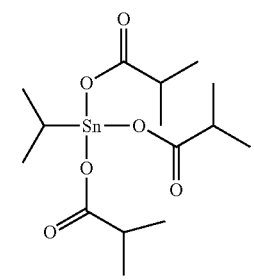

Chemical Formula 8

-continued

Chemical Formula 9

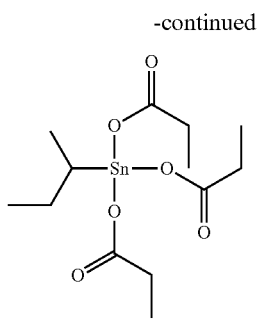

Chemical Formula 10

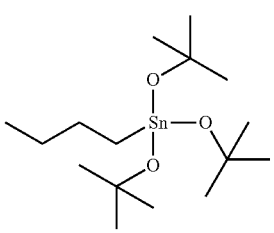

Chemical Formula 11

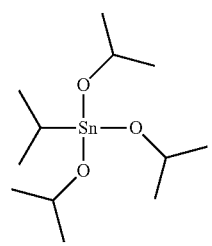

Chemical Formula 12

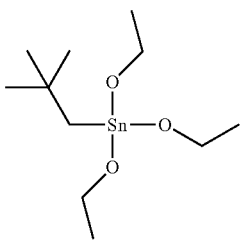

Chemical Formula 13

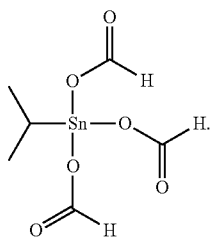

A related organic resist may generally have insufficient etch resistance and thus a pattern having a high aspect ratio may collapse.

A related inorganic resist (e.g., a metal oxide compound) may use a mixture of sulfuric acid having high corrosiveness and hydrogen peroxide, and thus may be difficult to handle and may have insufficient storage-stability. Additionally, such related inorganic resist may be relatively difficult to structurally change for performance improvement as a composite mixture, and a developing solution having a high concentration should be utilized.

In contrast, the semiconductor resist composition according to embodiments of the present disclosure may have relatively improved (e.g., suitable) etch resistance and sensitivity, and may be handled more easily compared with related organic and/or inorganic resists, as the organometallic compound includes a structural unit where various organic groups are bonded with the central metal atom as described above.

For example, when an aliphatic hydrocarbon group or an -alkylene-O-alkyl group (such as $R^1$) is bonded with the central metal atom in addition to a metal-oxygen bond in the organometallic compound represented by Chemical Formula 1, solubility of the compound in the solvent is improved and the Sn—$R^1$ bond is dissociated during an extreme ultraviolet (UV) exposure to generate a radical. Accordingly, a pattern having improved sensitivity and limit resolution may be formed by using the semiconductor resist composition including the organometallic compound.

In addition, the pattern formed by using the semiconductor resist composition according to an embodiment may not collapse while having a high aspect ratio.

In the semiconductor resist composition according to an embodiment, the organometallic compound represented by Chemical Formula 1 may be included in an amount of about 0.01 wt % to about 10 wt % based on a total weight of the composition. Within these ranges, storage-stability is improved and a thin layer may be easily formed.

In one or more embodiments, the semiconductor resist composition according to an embodiment may include the organometallic compound and a solvent.

The solvent of the semiconductor resist composition according to the embodiment may be an organic solvent, and may include, for example, aromatic compounds (e.g., xylene, toluene, and/or the like), alcohols (e.g., 4-methyl-2-pentenol, 4-methyl-2-propanol, 1-butanol, methanol, isopropyl alcohol, 1-propanol, and/or the like), ethers (e.g., anisole, tetrahydrofuran, and/or the like), esters (e.g., n-butyl acetate, propylene glycol monomethyl ether acetate, ethyl acetate, ethyl lactate, and/or the like), ketones (e.g., methyl ethyl ketone, 2-heptanone, and/or the like), a mixture thereof, and/or the like, but is not limited thereto.

In an embodiment, the semiconductor resist composition may further include a resin in addition to the organometallic compound and the solvent.

The resin may be a phenol-based resin including at least one aromatic moiety of Group 1:

Group 1

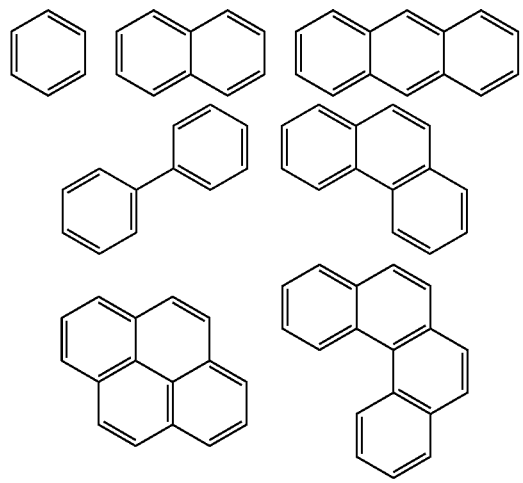

-continued

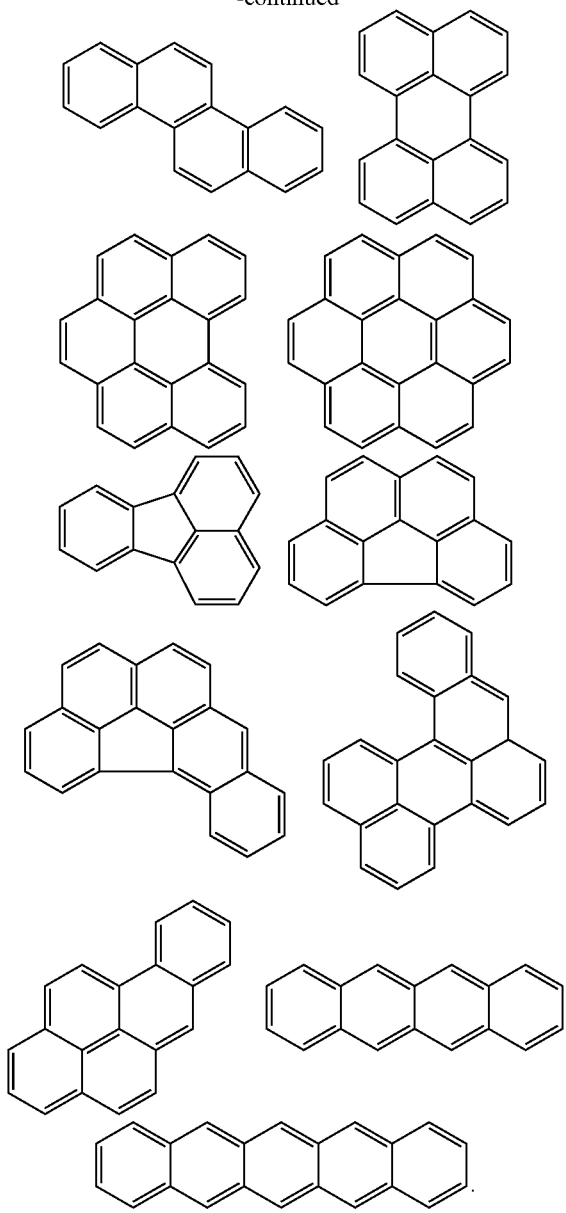

The resin may have a weight average molecular weight of about 500 to about 20,000.

The resin may be included in an amount of about 0.1 wt % to about 50 wt % based on a total amount of the semiconductor resist composition.

When the resin is included within these amount ranges, excellent (or suitable) etch resistance and heat resistance may be obtained.

In one or more embodiments, the semiconductor resist composition according to an embodiment may include the organometallic compound, the solvent, and the resin. However, the semiconductor resist composition according to the embodiment is not limited thereto and may further include additives as needed. Non-limiting examples of the additives may include a surfactant, a cross-linking agent, a leveling agent, or a combination thereof.

The surfactant may include, for example, an alkyl benzene sulfonate salt, an alkyl pyridinium salt, polyethylene glycol, a quaternary ammonium salt, and/or the like, but is not limited thereto.

The cross-linking agent may be, for example, a melamine-based, substituted urea-based, or a polymer-based cross-linking agent, but is not limited thereto. In an embodiment, the cross-linking agent may have at least two cross-linking forming substituents, for example, the cross-linking agent may be a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and/or the like.

The leveling agent may be used for improving coating flatness during printing and may be any suitable leveling agent.

A use amount of the additives may be controlled depending on desired properties.

In some embodiments, the semiconductor resist composition may further include a silane coupling agent as an adherence enhancer, in order to improve a close-contacting force with the substrate (e.g., to improve the adherence of the semiconductor composition to the substrate). The silane coupling agent may be, for example, a silane compound including a carbon-carbon unsaturated bond (such as vinyltrimethoxysilane, vinyltriethoxysilane, vinyl trichlorosilane, and/or vinyltris(p-methoxyethoxy)silane), 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane, trimethoxy[3-(phenylamino)propyl]silane, and/or the like, but is not limited thereto.

The semiconductor resist composition may be formed into a pattern having a high aspect ratio without a collapse (or with a significantly reduced risk of collapse). For example, in order to form a fine pattern having a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor resist composition may be used for a photoresist process using light in a wavelength ranging from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor resist composition according to an embodiment may be used to realize extreme ultraviolet (UV) lithography using an EUV light source of a wavelength of about 13.5 nm.

According to another embodiment, a method of forming patterns using the semiconductor resist composition is provided. For example, the manufactured pattern may be a photoresist pattern.

The method of forming patterns according to an embodiment includes forming an etching subject layer on a substrate, coating the semiconductor resist composition on the etching subject layer to form a photoresist layer, patterning the photoresist layer to form a photoresist pattern, and etching the etching subject layer using the photoresist pattern as an etching mask.

Hereinafter, a method of forming patterns using the semiconductor resist composition is described referring to FIGS. 1-5. FIGS. 1-5 are cross-sectional views of acts of a method of forming patterns using the semiconductor resist composition according to an embodiment.

Referring to FIG. 1, a subject for etching is prepared. The etching subject may be a thin layer 102 formed on a semiconductor substrate 100. For example, the thin layer 102 may be a thin film. Hereinafter, for ease of description, the etching subject will be limited to the thin layer 102. An entire surface of the thin layer 102 is washed to remove impurities and the like remaining thereon. The thin layer 102 may be, for example, a silicon nitride layer, a polysilicon layer, and/or a silicon oxide layer, without limitation.

Subsequently, a resist underlayer composition for forming a resist underlayer 104 is spin-coated on the surface of the washed thin layer 102. However, the embodiment is not limited thereto, and any suitable coating method may be used, for example, a spray coating, a dip coating, a knife edge coating, a printing method (such as an inkjet printing and/or a screen printing), and/or the like. Hereinafter, the present description will refer to the coating of the resist underlayer, without reference to the specific coating method used.

Then, the coated composition is dried and baked to form a resist underlayer 104 on the thin layer 102. The baking may be performed at about 100° C. to about 500° C., for example, about 100° C. to about 300° C.

The resist underlayer 104 is formed between the substrate 100 and a photoresist layer 106 and may prevent or reduce non-uniformity of a photoresist line width and improve pattern-forming capability, when a ray reflected from the interface between the substrate 100 and the photoresist layer 106, or a hardmask between the layers, is scattered into an unintended photoresist region.

Figure 2:
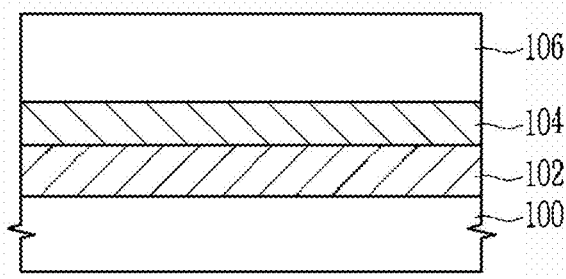

Referring to FIG. 2, the photoresist layer 106 is formed by coating the semiconductor resist composition on the resist underlayer 104. In some embodiments, the photoresist layer 106 is obtained by coating the semiconductor resist composition on the thin layer 102 formed on the substrate 100 and then, curing it by heat treatment.

For example, the formation of a pattern by using the semiconductor resist composition may include coating the semiconductor resist composition on the substrate 100 having the thin layer 102 thereon through spin coating, slit coating, inkjet printing, and/or the like and then, drying the coated composition to form the photoresist layer 106.

The semiconductor resist composition may the same as described above, and a duplicative description thereof will not be provided.

Subsequently, a substrate 100 having the photoresist layer 106 coated thereon is subjected to a first baking process. The first baking process may be performed at about 80° C. to about 120° C.

Figure 3:
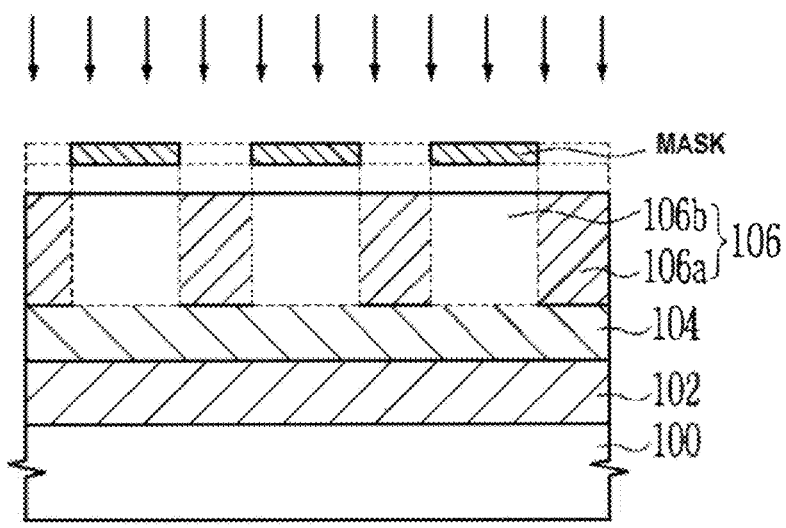

Referring to FIG. 3, the photoresist layer 106 may be selectively exposed.

For example, the act of exposure may utilize an activation radiation with light having a high energy wavelength such as EUV (Extreme UltraViolet; a wavelength of about 13.5 nm), an E-Beam (an electron beam), and, optionally, as well as an i-line (a wavelength of about 365 nm), a KrF (krypton fluoride) excimer laser (a wavelength of about 248 nm), an ArF (argon fluoride) excimer laser (a wavelength of about 193 nm), and/or the like.

For example, light for the exposure according to an embodiment may have a short wavelength ranging from about 5 nm to about 150 nm and a high energy wavelength, for example, EUV (Extreme UltraViolet; a wavelength of about 13.5 nm), an E-Beam (an electron beam), and/or the like.

An exposed region 106a of the photoresist layer 106 has different solubility from that of a non-exposed region 106b of the photoresist layer 106, as a polymer is formed in the exposed region 106a by a cross-linking reaction such as condensation between organometallic compounds.

Subsequently, the substrate 100 is subjected to a second baking process. The second baking process may be performed at a temperature of about 90° C. to about 200° C. The exposed region 106a of the photoresist layer 106 becomes substantially indissoluble in a developing solution due to the second baking process.

Figure 4:
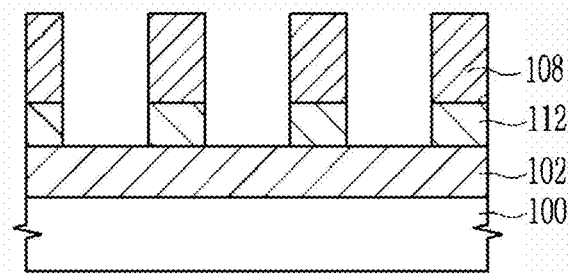

In FIG. 4, the non-exposed region 106b of the photoresist layer 106 is dissolved and removed using the developing solution to form a photoresist pattern 108. Specifically, the non-exposed region 106b of the photoresist layer is dissolved and removed by using an organic solvent such as 2-heptanone and/or the like to complete the photoresist pattern 108 corresponding to the negative tone image.

As described above, a developing solution used in a method of forming patterns according to an embodiment may be an organic solvent. Non-limiting examples of the organic solvent used in the method of forming patterns according to an embodiment may include, for example, ketones (such as methylethylketone, acetone, cyclohexanone, 2-heptanone, and/or the like), alcohols (such as 4-methyl-2-propanol, 1-butanol, isopropanol, 1-propanol, methanol, and/or the like), ethers (such as propylene glycol monomethyl ester acetate, ethyl acetate, ethyl lactate, n-butyl acetate, butyrolactone, and/or the like), aromatic compounds (such as benzene, xylene, toluene, and/or the like), and combinations thereof.

However, the photoresist pattern according to an embodiment is not necessarily limited to the negative tone image but may be formed to have a positive tone image. Here, a developing agent used for forming the positive tone image may be a quaternary ammonium hydroxide composition such as tetraethylammonium hydroxide, tetrapropylammonium hydroxide, tetrabutylammonium hydroxide, or a combination thereof.

As described above, the photoresist pattern 108 formed by being exposed to light having high energy such as EUV (Extreme UltraViolet; wavelength of about 13.5 nm) or E-Beam (an electron beam) as well as light having i-line (a wavelength of about 365 nm), KrF excimer laser (a wavelength of about 248 nm), ArF excimer laser (a wavelength of about 193 nm), and/or the like may have a width of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm, without limitation.

In some embodiments, the photoresist pattern 108 may have a pitch of less than or equal to about 50 nm, for example less than or equal to about 40 nm, less than or equal to about 30 nm, or less than or equal to about 25 nm, and a line width roughness of less than or equal to about 10 nm, or less than or equal to about 5 nm, without limitation.

Subsequently, the photoresist pattern 108 is used as an etching mask to etch the resist underlayer 104. Through this etching process, an organic layer pattern 112 is formed. The organic layer pattern 112 also may have a width corresponding to that of the photoresist pattern 108.

Figure 5:
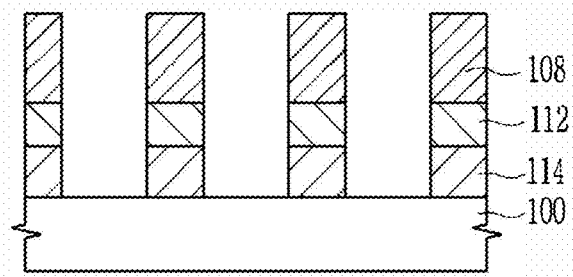

Referring to FIG. 5, the photoresist pattern 108 is applied as an etching mask to etch the exposed thin layer 102. As a result, the thin layer is formed with a thin layer pattern 114.

The etching of the thin layer 102 may be, for example, dry etching using an etching gas and the etching gas may be, for example, $CHF_3$, $CF_4$, $Cl_2$, $BCl_3$ or a mixed gas thereof.

In the exposure process, the thin layer pattern 114 formed by using the photoresist pattern 108 formed through the exposure process performed by using an EUV light source may have a width corresponding to that of the photoresist pattern 108. For example, the thin layer pattern 114 may have a width of about 5 nm to about 100 nm, which may be equal to that of the photoresist pattern 108. For example, the thin layer pattern 114 formed by using the photoresist pattern 108 formed through the exposure process performed by using an EUV light source may have a width of about 5 nm to about 90 nm, about 5 nm to about 80 nm, about 5 nm to about 70 nm, about 5 nm to about 60 nm, about 10 nm to about 50 nm, about 10 nm to about 40 nm, about 10 nm to about 30 nm, or about 10 nm to about 20 nm, and in some embodiments, less than or equal to about 20 nm, and may correspond to the width of the photoresist pattern 108.

Hereinafter, the present invention is described in more detail through Examples regarding preparation of the semiconductor resist composition including the organometallic compound of the present embodiments. However, the present invention is not limited by the following Examples.

Synthesis Example 1

25 ml of acetic acid was slowly added in a dropwise fashion to a compound represented by Chemical Formula A-1 (10 g, 25.6 mmol) at room temperature, and the mixture was heated and refluxed at 110° C. for 24 hours.

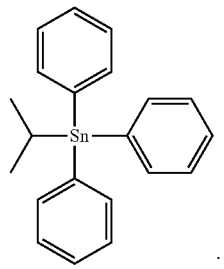

Chemical Formula A-1

Subsequently, the temperature was decreased down to room temperature, and the acetic acid was vacuum-distilled to obtain a compound represented by Chemical Formula 5 (a yield: 90%).

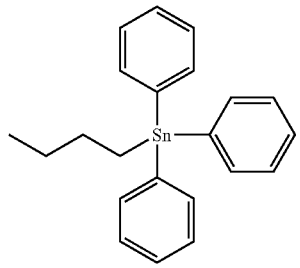

Chemical Formula 5

Synthesis Example 2

25 ml of acrylic acid was slowly added in a dropwise fashion to a compound represented by Chemical Formula A-2 (10 g, 25.4 mmol) at room temperature, and the mixture was heated and refluxed at 80° C. for 6 hours.

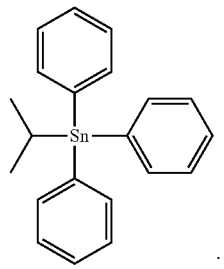

Chemical Formula A-2

Subsequently, the temperature was decreased down to room temperature, and the acrylic acid was vacuum-distilled to obtain a compound represented by Chemical Formula 6 (a yield: 50%).

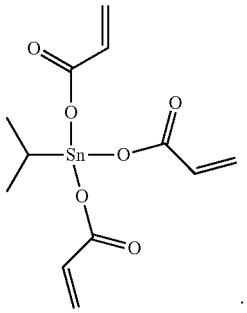

Chemical Formula 6

Synthesis Example 3

25 ml of propionic acid was slowly added in a dropwise fashion to a compound represented by Chemical Formula A-3 (10 g, 23.7 mmol) at room temperature, and the mixture was heated and refluxed at 110° C. for 24 hours.

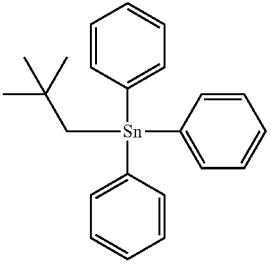

Chemical Formula A-3

Subsequently, the temperature was decreased down to room temperature, and the propionic acid was vacuum-distilled to obtain a compound represented by Chemical Formula 7 (a yield: 95%).

Chemical Formula 7

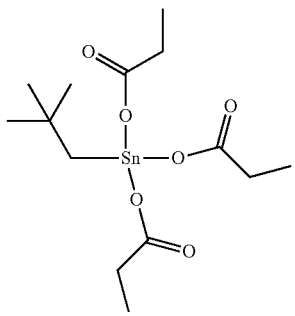

Synthesis Example 4

25 ml of isobutyric acid was slowly added in a dropwise fashion to the compound represented by Chemical Formula A-2 (10 g, 25.4 mmol) according to Synthesis Example 2 at room temperature, and the mixture was heated and refluxed at 110° C. for 24 hours.

Subsequently, the temperature is decreased down to room temperature, and the isobutyric acid was vacuum-distilled to obtain a compound represented by Chemical Formula 8 (a yield: 95%).

Chemical Formula 8

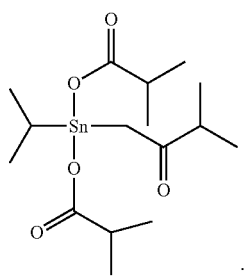

Synthesis Example 5

25 ml of propionic acid was slowly added in a dropwise fashion to a compound represented by Chemical Formula A-4 (10 g, 24.6 mmol) at room temperature, and the mixture was heated and refluxed at 110° C. for 24 hours.

Chemical Formula A-4

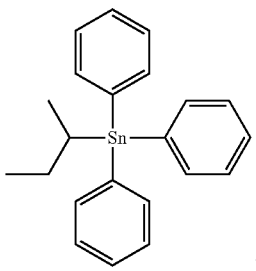

Subsequently, the temperature was decreased down to room temperature, and the propionic acid was vacuum-distilled to obtain a compound represented by Chemical Formula 9 (a yield: 90%).

Chemical Formula 9

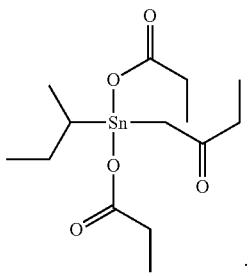

Synthesis Example 6

The compound represented by Chemical Formula A-1 (10 g, 24.6 mmol) was dissolved in 50 mL of $CH_2Cl_2$, and a 4 M HCl diethylether solution (3 equivalent, 36.9 mmol) was slowly added thereto in a dropwise fashion at −78° C. for 30 minutes. Subsequently, the mixture was stirred at room temperature for 12 hours, and a solvent therein was concentrated to obtain a compound represented by Chemical Formula A-5 (a yield: 80%)

Chemical Formula A-5

The compound represented by Chemical Formula A-5 (10 g, 35.4 mmol) was dissolved in 30 ml of anhydrous pentane, and the resulting solution was cooled down to 0° C. Subsequently, diethylamine (7.8 g, 106.3 mmol) was slowly added thereto in a dropwise fashion, t-BuOH (7.9 g, 106.3 mmol) was added thereto, and the obtained mixture was stirred at room temperature for 1 hour. When the reaction was complete, the resultant was filtered, concentrated, and vacuum-dried to obtain a compound represented by Chemical Formula 10 (a yield: 60%).

Chemical Formula 10

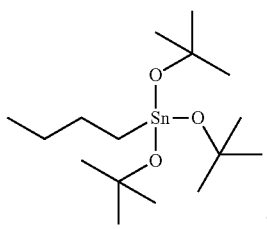

Synthesis Example 7

A compound represented by Chemical Formula A-6 (a yield: 75%) was prepared under the same (or substantially the same) conditions as in the synthesis of the compound represented by Chemical Formula A-5, except for using the compound represented by Chemical Formula A-2 instead of the compound represented by Chemical Formula A-1.

Chemical Formula A-6

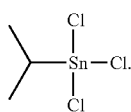

The compound represented by Chemical Formula A-6 (10 g, 37.3 mmol) was dissolved in anhydrous pentane, and the solution was cooled down to 0° C. Subsequently, diethylamine (8.2 g, 111.9 mmol) was slowly added thereto in a dropwise fashion, isopropanol (6.7 g, 111.9 mmol) was added thereto, and the obtained mixture was stirred at room temperature for 1 hour. When the reaction was complete, the resultant was filtered, concentrated, and vacuum-dried to obtain a compound represented by Chemical Formula 11 (a yield: 65%).

Chemical Formula 11

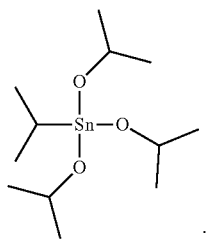

Synthesis Example 8

A compound represented by Chemical Formula A-7 (a yield: 70%) was prepared under the same (or substantially the same) conditions as in the synthesis of the compound represented by Chemical Formula A-5, except for using the compound represented by Chemical Formula A-3 instead of the compound represented by Chemical Formula A-1.

Chemical Formula A-7

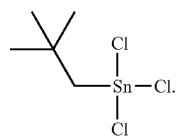

The compound represented by Chemical Formula A-7 (10 g, 18.7 mmol) was dissolved in anhydrous pentane, and the solution was cooled down to 0° C. Subsequently, diethylamine (7.4 g, 101.3 mmol) was slowly added thereto in a dropwise fashion, ethanol (6.1 g, 101.3 mmol) was added thereto, and the mixture was stirred at room temperature for 1 hour. When the reaction was complete, the resultant was filtered, concentrated, and vacuum-dried to obtain a compound represented by Chemical Formula 12 (a yield: 60%).

Chemical Formula 12

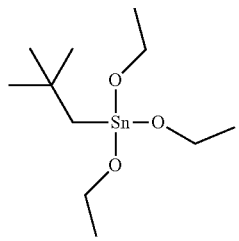

Synthesis Example 9

25 ml of formic acid was slowly added in a dropwise fashion to a compound represented by Chemical Formula A-2 (10 g, 25.4 mmol) at room temperature, and the mixture was heated and refluxed at 100° C. for 24 hours.

Chemical Formula A-2

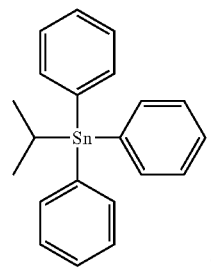

Subsequently, the temperature was decreased down to room temperature, and the formic acid was vacuum-distilled to obtain a compound represented by Chemical Formula 13 (a yield: 90%).

Chemical Formula 13

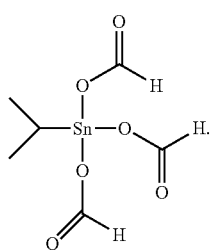

Comparative Synthesis Example

Dibutyltin dichloride (10 g, 33 mmol) was dissolved in 30 mL of ether, 70 mL of a 1 M sodium hydroxide (NaOH) aqueous solution was added thereto, and the mixture was stirred for one hour. After the stirring, a solid produced therein was filtered, three times washed with 25 mL of deionized water, and dried at 100° C. under a reduced pressure to obtain an organometallic compound represented by Chemical Formula 14 and having a weight average molecular weight of 1,500.

Chemical Formula 14

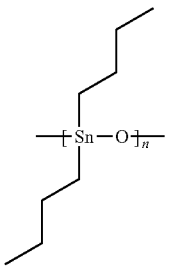

EXAMPLES

Each organometallic compound according to Synthesis Examples 1 to 9 was dissolved at a concentration of 2 wt % in xylene, and the solution was filtered with a 0.1 μm PTFE syringe filter to prepare each semiconductor resist composition according to Examples 1 to 8.

A 4 inch-disk silicon wafer having a native-oxide surface was used as a substrate for depositing a thin layer film, and the substrate was pretreated for 10 minutes under a UV ozone cleaning system. Then, the semiconductor resist compositions according to Examples 1 to 9 were respectively spin-coated at 1500 rpm for 30 seconds, baked (after applying the compositions, post-apply baked (PAB)) at 100° C. on a hot plate for 120 seconds to form each thin layer.

After the coating and baking, thicknesses of the obtained films were measured through ellipsometry and the resultant thickness was about 40 nm for each layer.

Comparative Example

A semiconductor resist composition was prepared by dissolving the compound of Chemical Formula 14 synthesized in Comparative Synthesis Example in 4-methyl-2-pentanol at a concentration of 1 wt %, and the solution was filtered with a 0.1 μm PTFE syringe filter.

Subsequently, the semiconductor resist composition according to Comparative Example was used to form a thin layer on a substrate through the same process as in the Examples.

After the coating and baking, the thickness of the obtained film was measured through ellipsometry and was about 40 nm.

Evaluation 1

A linear array of 50 disk pads each having a diameter of 500 μm was transferred into a wafer coated with each resist of Examples 1 to 9 and Comparative Example by using EUV ray (Lawrence Berkeley National Laboratory Micro Exposure Tool, MET). Exposure times of the pads were adjusted to apply an increased EUV dose to each pad.

Subsequently, the resists and the substrate were respectively exposed and then baked (post-exposure baked, PEB) on a hotplate at 150° C. for 120 seconds. The baked film was dipped in a developing solution (2-heptanone) for 30 seconds, washed with the same developing agent for 10 seconds to form a negative tone image, that is, remove a non-exposed coating region. Finally, the resultant was baked on a 150° C. hot plate for 2 minutes to complete the process.

A residual resist thickness of the exposed pads was measured by an ellipsometer. The residual thickness was measured depending on each exposure dose and calculated therewith as a function to obtain $D_g$ (an energy level where a development was complete), and the results are shown in Table 1.

Additionally, solubility and storage stability of each semiconductor resist composition according to Examples 1 to 9 and Comparative Example were evaluated, and the results are shown in Table 1.

Solubility

Solubility of the compounds represented by Chemical Formulae 5 to 13 according to Synthesis Examples 1 to 9 and Chemical Formula 14 according to Comparative Synthesis Example was evaluated by dissolving them according to the following weights in xylene as a reference. The results are denoted as follows:

○: greater than or equal to 3 wt % dissolved in xylene
Δ: greater than or equal to 1 wt % and less than 3 wt % dissolved in xylene
X: less than 1 wt % dissolved in xylene.

Storage Stability

Storage stability of the semiconductor resist compositions according to Examples 1 to 8 and Comparative Example was evaluated by allowing the resist compositions to stand for a particular time at room temperature (0° C. to 30° C.) and examining their precipitation degrees with naked eyes. The results are denoted as follows:

○: storable for greater than or equal to 1 month
Δ: storable for 1 week to less than 1 month
X: storable for less than 1 week

TABLE 1

| | solubility | storage stability | $D_g$ (mJ/cm$^2$) |
|---|---|---|---|
| Example 1 | ○ | ○ | 22.72 |
| Example 2 | ○ | ○ | 5.85 |
| Example 3 | ○ | ○ | 25.21 |
| Example 4 | ○ | ○ | 18.44 |
| Example 5 | ○ | ○ | 15.75 |
| Example 6 | Δ | ○ | 31.18 |
| Example 7 | Δ | ○ | 25.21 |
| Example 8 | Δ | ○ | 31.18 |
| Example 9 | ○ | ○ | 18.44 |
| Comparative Example | X | — | — |

Referring to the results of Table 1, the semiconductor resist compositions according to Examples 1 to 9 showed excellent solubility and storage stability compared with that of the Comparative Example, and the patterns formed of the resist compositions of Examples 1 to 8 showed excellent sensitivity compared with a pattern formed of the semiconductor resist composition according to Comparative Example. In contrast, the semiconductor resist composition according to Comparative Example showed insufficient solubility about (in) a xylene solvent, and thus storage-stability of the composition and pattern formation by using the same were difficult to evaluate.

Evaluation 2

Figure 6:
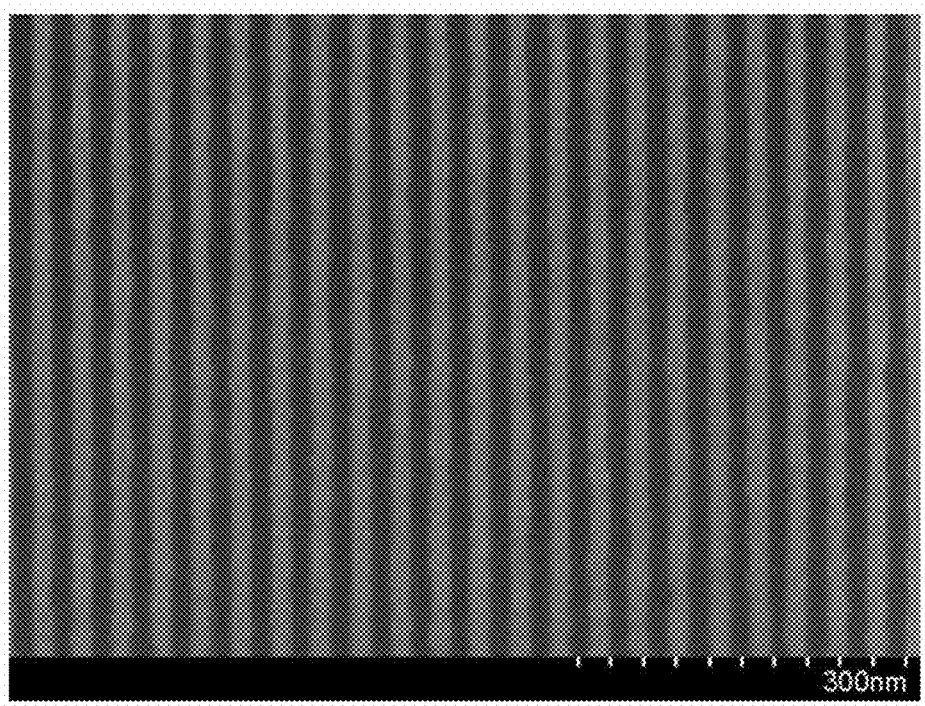
FIG. 6 shows a SEM image of a resist line obtained by using the semiconductor resist composition according to an embodiment and patterning the same with a 36 nm pitch having a calculated line width roughness (LWR) of 3.4 nm.

A substrate coated with each resist according to Examples 1 to 9 and Comparative Example was exposed to an extreme ultraviolet (UV) ray (Lawrence Berkeley National Laboratory Micro Exposure Tool). A 18 nm line pattern of 36 nm pitch was transferred on a wafer by using a wavelength radiation of 13.5 nm, a dipole illumination, and a numerical aperture of 0.3, and an imaging ray dose of 67 mJ/cm$^2$. Subsequently, the patterned resist and substrate was baked (PEB) at 180° C. for 2 minutes. Subsequently, the film was dipped in 2-heptanone for 30 seconds and washed with the same developing agent additionally for 15 seconds to form a negative tone image, that is, to remove a non-exposed coating region. After the development, the film was finally baked on a 150° C. hot plate for 5 minutes. FIG. 6 is a SEM image of Example 3 (using the compound of Chemical Formula 7) showing a resist line patterned with a pitch of 36 nm to have a calculated line width roughness (LWR) of 3.4 nm.

Referring to FIG. 6, a photoresist pattern satisfying a desired line and space was well formed without a pattern collapse.

As used herein, expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, the certain example embodiments of the present invention have been described and illustrated, however, it should be apparent to a person with ordinary skill in the art that the present invention is not limited to the example embodiment as described, and may be variously modified and transformed without departing from the spirit and scope of the present invention. Accordingly, the modified or transformed example embodiments may be understood from the technical ideas and aspects of the present invention, and the modified example embodiments are within the scope of the appended claims of the present invention and equivalents thereof.

What is claimed is:

1. A system of patterns, the system comprising:
a semiconductor resist composition to be coated on an etching subject layer to form a photoresist layer;
the photoresist layer being to be patterned to form a photoresist pattern; and
the etching subject layer being to be etched with the photoresist pattern as an etching mask,
wherein the semiconductor resist composition comprises:
an organometallic compound represented by Chemical Formula 1, and
a solvent:

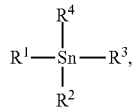

Chemical Formula 1 wherein, in Chemical Formula 1, $R^1$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 to C30 benzyl group, and —$R^c$—O—$R^d$, wherein $R^c$ is a substituted or unsubstituted C1 to C20 alkylene group and $R^d$ is a substituted or unsubstituted C1 to C20 alkyl group, $R^2$ to $R^4$ are each independently selected from —$OR^a$ and —$OC(=O)R^b$, wherein at least one of $R^2$ to $R^4$ is —$OC(=O)R^b$, $R^a$ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and combinations thereof, and $R^b$ is selected from hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, and combinations thereof.

2. The system of claim 1, wherein in the semiconductor resist composition, $R^1$ is selected from a substituted or unsubstituted C1 to C10 alkyl group, a substituted or unsubstituted C3 to C20 cycloalkyl group, a substituted or unsubstituted C3 to C20 alkenyl group, a substituted or unsubstituted C3 to C20 alkynyl group, and —$R^c$—O—$R^d$, wherein $R^c$ is a substituted or unsubstituted C1 to C20 alkylene group and $R^d$ is a substituted or unsubstituted C1 to C20 alkyl group.

3. The system of claim 1, wherein in the semiconductor resist composition, $R^a$ is selected from a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group, and $R^b$ is selected from hydrogen, a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group.

4. The system of claim 1, wherein in the semiconductor resist composition, the organometallic compound is represented by at least one of Chemical Formula 3 to Chemical Formula 4:

Chemical Formula 3

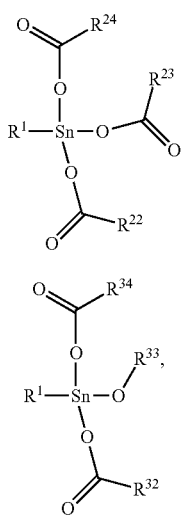

Chemical Formula 4

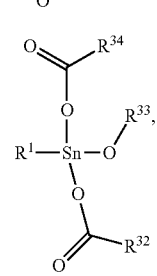

wherein, in Chemical Formula 3 to Chemical Formula 4,
R¹ is selected from a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 to C30 benzyl group, and —$R^c$—O—$R^d$, wherein $R^c$ is a substituted or unsubstituted C1 to C20 alkylene group and $R^d$ is a substituted or unsubstituted C1 to C20 alkyl group, $R^{33}$ are each independently selected from a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group, and $R^{22}$, $R^{23}$, $R^{24}$, $R^{32}$, and $R^{34}$ are each independently selected from hydrogen, a substituted or unsubstituted C1 to C10 alkyl group, a substituted or unsubstituted C3 to C20 cycloalkyl group, a substituted or unsubstituted C2 to C8 alkenyl group, a substituted or unsubstituted C2 to C8 alkynyl group, and a substituted or unsubstituted C6 to C30 arylalkyl group.

5. The system of claim 4, wherein in the semiconductor resist composition, R¹ is selected from a substituted or unsubstituted C1 to C10 alkyl group, a substituted or unsubstituted C3 to C20 cycloalkyl group, a substituted or unsubstituted C3 to C20 alkenyl group, a substituted or unsubstituted C3 to C20 alkynyl group, and —$R^c$—O—$R^d$, wherein $R^c$ is a substituted or unsubstituted C1 to C20 alkylene group and $R^d$ is a substituted or unsubstituted C1 to C20 alkyl group.

6. The system of claim 1, wherein the semiconductor resist composition further comprises an additive selected from a surfactant, a cross-linking agent, a leveling agent, and combinations thereof.

7. The system of claim 6, wherein the surfactant is selected from an alkyl benzene sulfonate salt, an alkyl pyridinium salt, polyethylene glycol, a quaternary ammonium salt, and combinations thereof.

8. The system of claim 6, wherein the cross-linking agent is a melamine-containing, substituted urea-containing, or a polymer-containing cross-linking agent.

9. The system of claim 1, wherein the semiconductor resist composition further comprises a silane coupling agent as an adherence enhancer.

10. The system of claim 1, wherein in the semiconductor resist composition, the organometallic compound is represented by at least one of Chemical Formula 5 to Chemical Formula 9 and Chemical Formula 13:

Chemical Formula 5

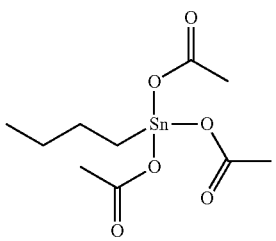

Chemical Formula 6

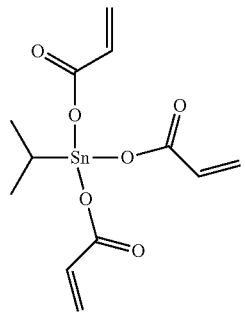

Chemical Formula 7

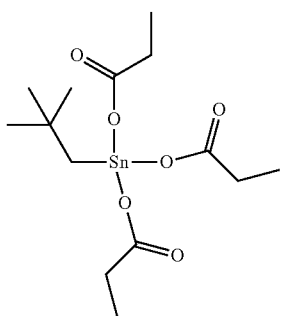

Chemical Formula 8

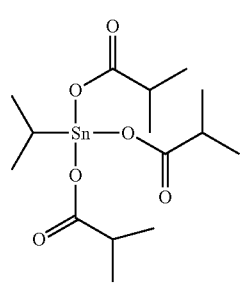

Chemical Formula 9
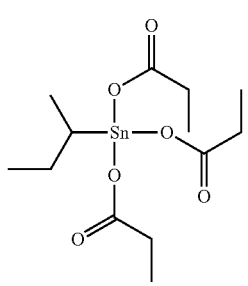
Chemical Formula 13
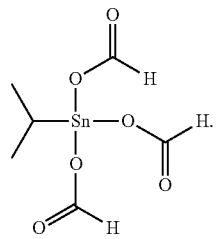
* * * * *